(12) United States Patent
Liang et al.

(10) Patent No.: US 11,222,771 B2
(45) Date of Patent: Jan. 11, 2022

(54) CHEMICAL CONTROL FEATURES IN WAFER PROCESS EQUIPMENT

(71) Applicant: Applied Materials, Inc., Santa Clara, CA (US)

(72) Inventors: Qiwei Liang, Fremont, CA (US); Rohit Sharma, Pune (IN); Jingyu Qiao, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 176 days.

(21) Appl. No.: 16/268,488

(22) Filed: Feb. 5, 2019

(65) Prior Publication Data

US 2019/0244792 A1 Aug. 8, 2019

Related U.S. Application Data

(60) Provisional application No. 62/626,313, filed on Feb. 5, 2018.

(51) Int. Cl.

| | |
|---|---|
| *C23C 16/455* | (2006.01) |
| *H01J 37/32* | (2006.01) |
| *H01L 21/67* | (2006.01) |
| *C23C 16/452* | (2006.01) |
| *C23C 16/50* | (2006.01) |

(52) U.S. Cl.
CPC .. *H01J 37/32449* (2013.01); *C23C 16/45565* (2013.01); *C23C 16/45591* (2013.01); *H01J 37/32357* (2013.01); *H01L 21/67069* (2013.01); *C23C 16/452* (2013.01); *C23C 16/45574* (2013.01); *C23C 16/50* (2013.01); *H01J 2237/002* (2013.01)

(58) Field of Classification Search
CPC ......... H01L 21/67069; C23C 16/45591; C23C 16/452; C23C 16/45565; C23C 16/45574; C23C 16/50; H01J 37/32449; H01J 37/32357; H01J 2237/002
See application file for complete search history.

(56) References Cited

U.S. PATENT DOCUMENTS

| | | | |
|---|---|---|---|
| 2007/0272154 A1* | 11/2007 | Amikura | C23C 16/45565 118/719 |
| 2011/0011338 A1* | 1/2011 | Chuc | H01J 37/32449 118/715 |
| 2012/0222815 A1* | 9/2012 | Sabri | C23C 16/45565 156/345.34 |

\* cited by examiner

*Primary Examiner* — Yuechuan Yu
(74) *Attorney, Agent, or Firm* — Likpatrick Townsend & Stockton LLP

(57) ABSTRACT

Gas distribution assemblies are described including a first plate and a second plate. The first plate may define a plurality of first apertures, and the second plate may define a plurality of second apertures in a first region of the second plate and a plurality of third apertures in a second region of the second plate. The second apertures may align with the first apertures. An area defined by the second region may be less than an area defined by the first region. The second plate may be sealingly coupled with the first plate to define a volume between the first plate and the second plate. The volume may be fluidly accessible from the third apertures, and fluidly isolated from the first and second apertures.

10 Claims, 8 Drawing Sheets

CHEMICAL CONTROL FEATURES IN WAFER PROCESS EQUIPMENT

CROSS-REFERENCE TO RELATED APPLICATIONS

This application claims the benefit of U.S. Provisional Application No. 62/626,313, filed Feb. 5, 2018, and which is hereby incorporated by reference in its entirety for all purposes.

TECHNICAL FIELD

The present technology relates to semiconductor processes and equipment. More specifically, the present technology relates to processing system fluid distribution components.

BACKGROUND

Semiconductor processing systems generally include a processing chamber having a pedestal for supporting a substrate, such as a semiconductor substrate, within the chamber proximate a processing region. A gas distribution assembly or showerhead may provide one or more process gases to the processing region for performing certain processes on the substrate in the processing region. These processes may include deposition processes, such as chemical vapor deposition (CVD), to deposit a material on the substrate or an etch reaction to remove material from the substrate, among other processes.

In processes that require multiple gases, the gases may be combined within a mixing chamber that is then coupled to the gas distribution assembly via a conduit. For example, in a conventional thermal CVD process, two process gases are supplied to a mixing chamber along with two respective carrier gases where they are combined to form a gaseous mixture. The gaseous mixture may be introduced directly to the chamber, or may travel through a conduit within an upper portion of the chamber to the distribution assembly. The distribution assembly generally includes a plate having a plurality of holes such that the gaseous mixture is evenly distributed into the processing region above the substrate.

Although mixing the gases prior to release into the processing region can ensure that the component gases are evenly mixed and uniformly distributed into the processing region, the gases tend to begin reaction within the mixing chamber or distribution assembly. Consequently, deposition on or etching of the mixing chamber, conduits, distribution assembly, and other chamber components may result prior to the gaseous mixture reaching the processing region. Additionally, reaction by-products may accumulate in the chamber gas delivery components or on the inside surface of the distribution assembly, thus generating, and/or increasing the presence of, unwanted particles.

Therefore, there is a continuing need for a gas distribution device that delivers at least two gases into a processing region without co-mingling of the gases prior to reaching the processing region. These and other needs are addressed by the present technology.

SUMMARY

Embodiments of gas distribution assemblies are described. In some embodiments, a gas distribution assembly may include a first plate and a second plate. The first plate may have a disk shape and a plurality of first apertures formed therethrough. The plurality of first apertures may extend beyond a lower surface of the first plate thereby forming a plurality of cylindrical bodies. The second plate may be positioned axially below the first plate and may have a disk shape. The second plate may include a plurality of second apertures formed in a first region of the second plate and through the second plate. The plurality of second apertures may align with the plurality of first apertures. The second plate may further include a plurality of third apertures formed in a second region of the second plate and through the second plate. An area defined by the second region may be less than an area defined by the first region. The second plate may be sealingly coupled with the first plate to define a volume between the first plate and the second plate. The volume may be fluidly accessible from the plurality of third apertures. The volume may be fluidly isolated from the plurality of first apertures and the plurality of second apertures.

In some embodiments, the first region and the second region may be similarly shaped and coaxially aligned with the second plate. The first region defines a circle having a diameter of about 50% of a diameter of the second plate. The diameter of the circle may be between about 2 inches and about 10 inches.

In some embodiments, the second plate may further include a third region having no second or third apertures formed therein. The first region, the second region, and the third region may be coaxially aligned with the second plate.

In some embodiments, each of the plurality of second apertures may be spaced apart from adjacent second apertures at an equal distance. The plurality of third apertures may be distributed evenly around the plurality of second apertures within the second region of the second plate.

In some embodiments, the gas distribution assembly may further include an annular body. The annular body may include an inner wall positioned at an inner diameter, an outer wall positioned at an outer diameter, an upper surface, a lower surface, an upper recess formed into the upper surface, a lower recess formed into the lower surface, and a fluid delivery channel in the annular body. The first plate may be positioned in the upper recess. The second plate may be positioned in the lower recess. The fluid delivery channel may be in fluid communication with the volume between the first plate and the second plate.

Embodiments of a method of delivering one or more fluids into a semiconductor processing chamber are provided. In some embodiments, the method may include flowing a first fluid through a gas distribution assembly having a first plate and a second plate. The second plate may be positioned axially below the first plate. The method may also include flowing a second fluid through the second plate. The method may further include forming a mixture of the first fluid and the second fluid in a semiconductor processing region of the semiconductor processing chamber. The semiconductor processing region may be defined at least in part by a lower surface of the second plate. The first plate may have a disk shape and may have a plurality of first apertures formed therethrough. The plurality of first apertures may extend beyond a lower surface of the first plate thereby forming a plurality of cylindrical bodies. The second plate may have a disk shape and may be positioned axially below the first plate. The second plate may include a plurality of second apertures formed in a first region of the second plate and through the second plate. The plurality of second apertures may align with the plurality of first apertures. The second plate may further include a plurality of third apertures formed in a second region of the second plate and through the second plate. An area defined by the second region may be less than an area defined by the first region. The second plate may be sealingly coupled with the first plate to define a volume between the first plate and the second plate. The volume may be fluidly accessible from the plurality of third apertures, and may be fluidly isolated from the plurality of first apertures and the plurality of second apertures.

In some embodiments, forming the mixture of the first fluid and the second fluid in the semiconductor processing region may include forming an uneven mixture of the first fluid and the second fluid in the semiconductor processing region. In some embodiments, forming the mixture of the first fluid and the second fluid in the semiconductor processing region may include filling a first volume of the semiconductor processing region with the first fluid and filling a second volume of the semiconductor processing region with the second fluid. The first volume may be substantially equal to an entire volume of the semiconductor processing region. The second volume may be contained within the first volume and may define substantially a frustum volume such that exposure of a wall of the semiconductor processing region to the second fluid may be reduced. In some embodiments, filling the second volume of the semiconductor processing region with the second fluid may include filling the second volume with a first concentration of the second fluid near an axis of the frustum volume and filling the second volume with a second concentration of the second fluid near a side surface of the frustum volume. The first concentration may be greater than the second concentration.

In some embodiments, the method may further include flowing a third fluid through the plurality of first apertures and the plurality of second apertures into the semiconductor processing region. The third fluid may include a treatment gas for removing deposition on the gas distribution assembly. In some embodiments, the first region and the second region may be similarly shaped and coaxially aligned with the second plate. In some embodiments, the first region may define a circle having a diameter of about 50% of a diameter of the second plate. In some embodiments, the diameter of the circle may be between about 2 inches and about 10 inches. In some embodiments, each of the plurality of second apertures may be spaced apart from adjacent second apertures at an equal distance. The plurality of third apertures may be distributed evenly around the plurality of second apertures within the second region of the second plate.

Embodiments of a semiconductor processing chamber are provided. The semiconductor processing chamber may include a gas distribution assembly having a first plate and a second plate. The first plate may have a disk shape and a plurality of first apertures formed therethrough. The plurality of first apertures may extend beyond a lower surface of the first plate thereby forming a plurality of cylindrical bodies. The second plate may have a disk shape and may be positioned axially below the first plate. The second plate may include a plurality of second apertures formed in a first region of the second plate and through the second plate. The plurality of second apertures may align with the plurality of first apertures. The second plate may further include a plurality of third apertures formed in a second region of the second plate and through the second plate. An area defined by the second region may be less than an area defined by the first region. The second plate may be sealingly coupled with the first plate to define a volume between the first plate and the second plate. The volume may be fluidly accessible from the plurality of third apertures. The volume may be fluidly isolated from the plurality of first apertures and the plurality of second apertures. In some embodiments, the semiconductor processing chamber may further include a baffle positioned axially above the gas distribution assembly.

Such technology may provide numerous benefits over conventional systems and techniques. For example, unwanted deposition on the gas distribution assembly and chamber walls may be reduced, which may lead to shortened cleaning time and less defects or particles formed in the film deposited on a substrate. The fluids, such as precursors, may be flowed at a much lower flow rate, which leads to reduced consumption of the precursors and improved uniformity of the film deposited because the reduced flow rate further may lead to reduced pressure inside the process chamber. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

The present technology includes improved gas distribution assembly or showerhead designs for distributing processing gases and precursors to produce flow patterns for forming deposition layers on a semiconductor substrate. While conventional showerhead designs may simply provide pass-through distribution systems for processing and precursor gases, the presently described technology allows for improved control of the flow characteristics of gases as they are delivered to a substrate processing chamber.

Although some conventional gas distribution assemblies or showerheads may include multiple fluid channels, those designs generally require high consumption of the precursors because unwanted deposition occurs at the showerhead and chamber walls. The unwanted deposition may drop from the showerhead and/or the chamber wall onto the substrate resulting in defects formed in the film deposited. Aspects of the present technology, however, overcome these issues by modifying the flow of the fluids through configuration of the showerhead that may reduce the unwanted deposition on the showerhead and the chamber wall.

Figure 1:
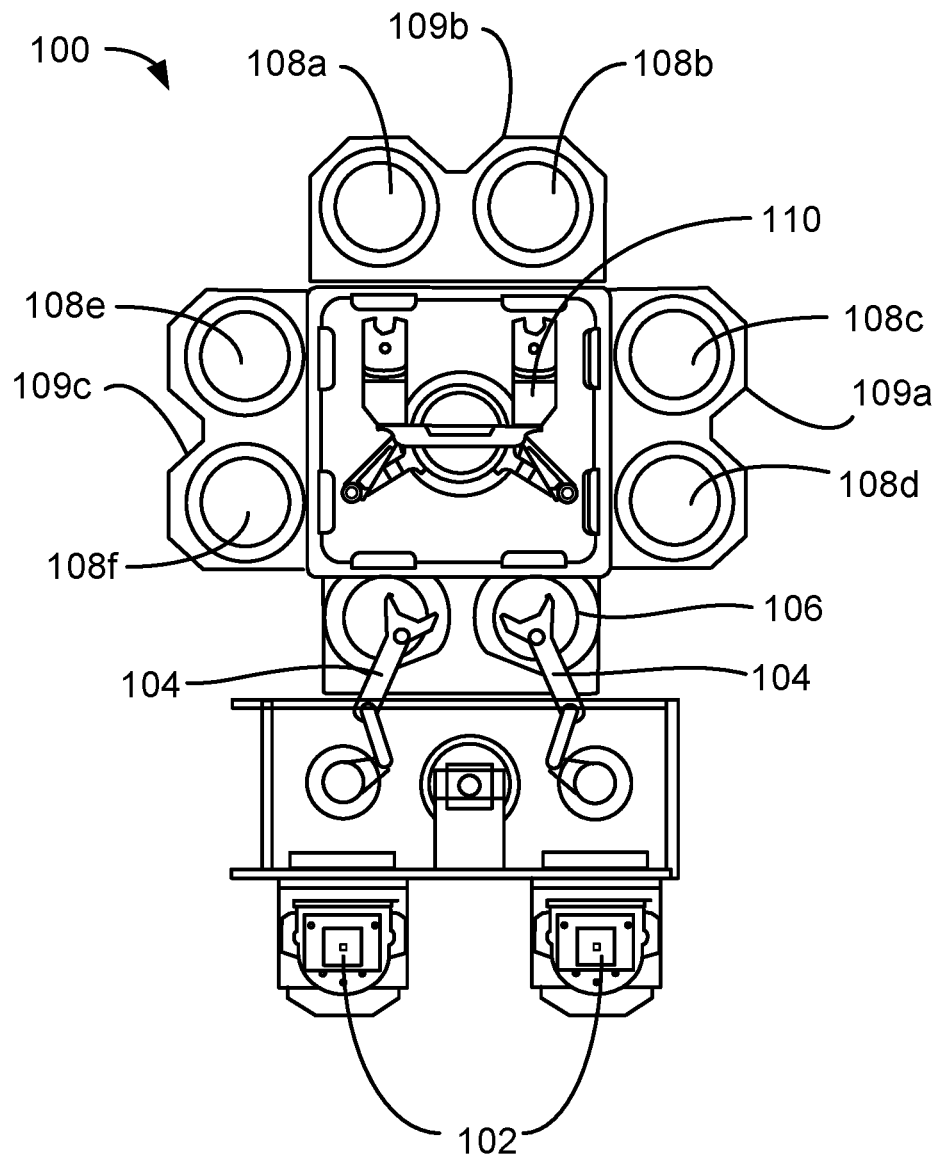
FIG. 1 shows a top plan view of one embodiment of an exemplary processing tool according to some embodiments of the present technology.

FIG. 1 shows a top plan view of one embodiment of a processing tool 100 of deposition, etching, baking, and/or curing chambers according to disclosed embodiments. In the figure, a pair of FOUPs (front opening unified pods) 102 supply substrates (e.g., various specified diameter semiconductor wafers) that may be received by robotic arms 104 and placed into a low-pressure holding area 106 before being placed into one of the substrate processing chambers 108*a-f* of the processing sections 109*a-c*. A second robotic arm 110 may be used to transport the substrates from the holding area 106 to the processing chambers 108*a-f* and back.

The substrate processing chambers 108*a-f* of the processing sections 109*a-c* may include one or more system components for depositing, annealing, curing and/or etching substrates or films thereon. Exemplary films may be flowable dielectrics, but many types of films may be formed or processed with the processing tool. In one configuration, two pairs of the processing chambers (e.g., 108*c-d* and 108*e-f*) may be used to deposit the dielectric material on the substrate, and the third pair of processing chambers (e.g., 108*a-b*) may be used to anneal the deposited dielectric. In another configuration, the two pairs of the processing chambers (e.g., 108*c-d* and 108*e-f*) may be configured to both deposit and anneal a dielectric film on the substrate, while the third pair of processing chambers (e.g., 108*a-b*) may be used for UV or E-beam curing of the deposited film. In still another configuration, all three pairs of processing chambers (e.g., 108*a-f*) may be configured to deposit and cure a dielectric film on the substrate or etch features into a deposited film.

In yet another configuration, two pairs of processing chambers (e.g., 108*c-d* and 108*e-f*) may be used for both deposition and UV or E-beam curing of the dielectric, while a third pair of processing chambers (e.g. 108*a-b*) may be used for annealing the dielectric film. In addition, one or more of the processing chambers 108*a-f* may be configured as a treatment chamber, and may be a wet or dry treatment chamber. These processing chambers may include heating the dielectric film in an atmosphere that includes moisture. Thus, embodiments of system 100 may include wet treatment processing chambers 108*a-b* and anneal processing chambers 108*c-d* to perform both wet and dry anneals on the deposited dielectric film. It will be appreciated that additional configurations of deposition, annealing, and curing chambers for dielectric films are contemplated by system 100.

Figure 2:
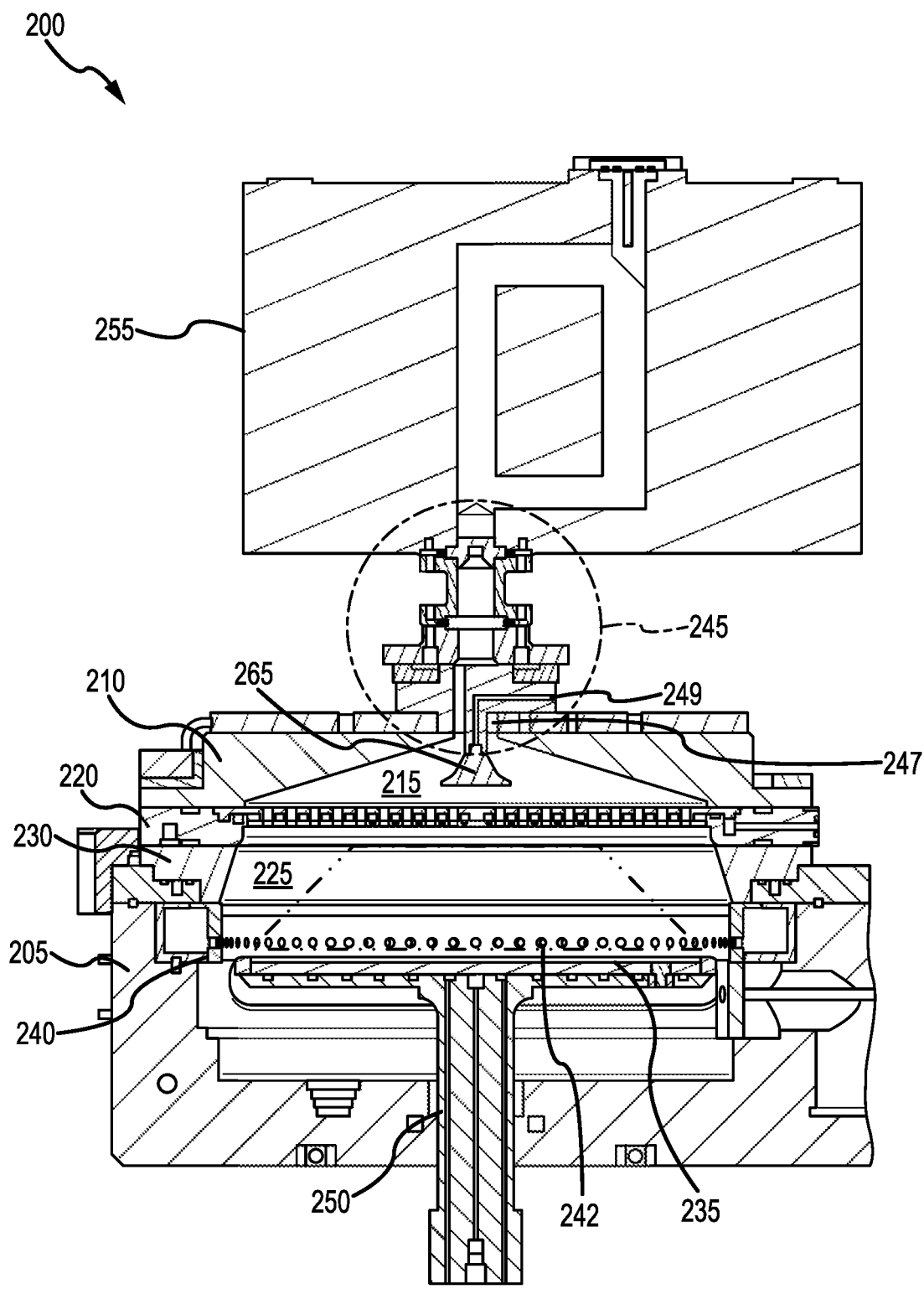
FIG. 2 shows a schematic cross-sectional view of an exemplary processing chamber according to some embodiments of the present technology.

FIG. 2 is a cross-sectional view of an exemplary processing chamber system 200 with partitioned regions within the processing chamber system 200. The processing chamber system 200 may include a chamber body 205 configured to support and/or house various components of the chamber system 200, such as a dome or lid 210, a gas distribution assembly or showerhead 220, a spacer ring 230, a pumping liner 240, a substrate support or pedestal 250, and so on. The lid 210 may be pyramidal, conical, or of another similar structure which may include a narrow top portion expanding to a wide bottom portion. Additional geometries of the lid 210 may also be used. The showerhead 220 may have a substantial horizontal orientation and may partition or divide the space within the processing chamber system 200 into a first region or plasma region 215 defined at least in part by the lid 210 and the showerhead 220, and a second region or processing region 225 defined at least in part by the showerhead 220, the spacer ring 230, the pumping liner 240, and the pedestal 250. The showerhead 220 may be configured to control and provide fluid flow into the processing region 225 from the plasma region 215 and/or other fluid sources as will be described in more detail below.

As shown in FIG. 2, a substrate 235 may be disposed on the pedestal 250 to be processed in the processing region 225. In some embodiments, the processing chamber system 200 may be configured for film deposition, such as silicon oxide, silicon nitride, silicon oxynitride, or silicon oxycarbide, etc. During film deposition, one or more process gases may be flowed into the plasma region 215 through a gas inlet assembly 245. A baffle 265 may additionally be located in the plasma region 215 to affect the flow of the process gases or other fluids into the plasma region 215 through the gas inlet assembly 245. Processing gases may include hydrogen-containing compounds, oxygen-containing compounds, nitrogen-containing compounds, or combinations thereof. Examples of suitable processing gases may include one or more of compounds selected from the group comprising of $H_2$, a $H_2/N_2$ mixture, $NH_3$, $NH_4OH$, $O_3$, $O_2$, $H_2O_2$, $N_2$, $N_xH_y$, compounds including $N_2H_4$ vapor, NO, $N_2O$, $NO_2$, water vapor, or combinations thereof.

In some embodiments, the process gas may be excited by a remote plasma system unit (RPS) 255 coupled with the gas inlet assembly 245. In some embodiments, the process gas may not be excited prior to introduction to the first plasma region 215, and the process gas may be excited in the plasma region 215. The lid 210 and the showerhead 220 may each include one or more conductive portions. An insulating ring (not shown) may be positioned in between the lid 210 and the showerhead 220, which may allow an AC potential to be applied to the lid 210 relative to the showerhead 220 such that a capacitively coupled plasma (CCP) of the process gas may be formed in the first region 215. In some embodiments, power may be applied to the first plasma region 215 to enhance the already excited process gas from the RPS 255. In some embodiments, the only excitation of the processing gas or precursors may be from exciting the processing gas in the RPS 255. Excited species derived from the process gas may travel from the plasma region 215 through the showerhead 220 into the processing region 225. Little or no plasma may be present in the processing region 225. While a plasma may not be generated in the processing region 225, a plasma may alternatively be generated in the processing region 225 in some embodiments.

Exciting the process gas in the first plasma region 215 directly, exciting the process gas in the RPS 255, or both, may provide several benefits. The concentration of the excited species derived from the process gas may be increased within the processing region 225 due to the plasma in the first plasma region 215. This increase may result from the location of the plasma in the first plasma region 215. The processing region 225 may be located closer to the first plasma region 215 than the remote plasma system (RPS) 255, leaving less time for the excited species to leave excited states through collisions with other gas molecules, walls of the chamber system 200, and surfaces of the showerhead 220.

The uniformity of the concentration of the excited species derived from the process gas may also be increased within the processing region 225. This may result from the shape of the first plasma region 215, which may be more similar to the shape of the processing region 225. Excited species created in the remote plasma system (RPS) 255 may travel greater distances in order to pass through apertures near the edges of the showerhead 220 relative to species that pass through apertures near the center of the showerhead 220.

The greater distance may result in a reduced excitation of the excited species and, for example, may result in a slower growth rate near the edge of a substrate. Exciting the process gas in the first plasma region 215 may mitigate this variation.

Upon entering into the processing region 225, the excited species derived from the process gas may react with one or more precursors, such as silicon-containing precursors, for flowable deposition of dielectric materials within the processing region 225. Examples of the silicon-containing precursors may include silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS), or combinations thereof. Additional precursors for the deposition of silicon nitride include $Si_xN_yH_z$-containing precursors, such as sillyl-amine and its derivatives including trisillylamine (TSA) and disillylamine (DSA), $Si_xN_yH_zO_{zz}$-containing precursors, $Si_xN_yH_zCl_{zz}$-containing precursors, or combinations thereof.

The one or more silicon-containing precursors may be flowed into the processing region 225 by the showerhead 220. As will be described in more detail below, the showerhead 220 may be configured to provide isolated fluid paths for the process gas from the plasma region 215 and the one or more silicon-containing precursors such that the excited derivatives of the process gas and the one or more silicon-containing precursors may not combine until they enter in the processing region 225. The excited derivatives of the process gas and the one or more silicon-containing precursors may combine above the substrate 235 and, on occasion, on the substrate 235 to form a film on the substrate 235 that may be flowable. For flowable films, as the film grows, more recently added material may possess a higher mobility than underlying material. Gaps may be filled by the flowable film using this technique without leaving traditional densities of organic content within the film after deposition is completed. A curing step may still be used to further reduce or remove the organic content from a deposited film.

With continued reference to FIG. 2, the inlet assembly 245 may include two or more distinct gas supply channels where a first gas supply channel 247 may carry a first gas that may pass through the RPS 255, while a second gas supply channel 249 may bypass the RPS 255 and may be used for carrying a second gas. The first gas and/or the second gas may include a process gas or precursors, such as the process discussed above. The first gas and/or the second gas may include a treatment gas. The treatment gas may be introduced to remove unwanted species from the chamber walls, the substrate, the deposited film and/or the film during deposition, such as hydrogen, carbon, and fluorine. The treatment gas may include one or more of the following gases, such as $H_2$, $N_2$, $NH_3$, $NH_4OH$, $O_3$, $O_2$, $H_2O_2$, $N_2$, $N_2H_4$, NO, $N_2O$, $NO_2$, water vapor, or combinations thereof. In some embodiments, the treatment gas may be excited in a plasma and then used to reduce or remove a residual organic content from the deposited film. In some embodiments, the treatment gas may be used without a plasma. In some embodiments, the treatment gas may be introduced from the RPS 255 or may bypass the RPS 255, and/or may further be excited in the first plasma region 215.

Although in the above description, the process gases and the treatment gases may be flowed via the first gas supply channel 247 and the second gas supply channel 249, respectively, into the plasma region 215, the process gases and the treatment gases may be flowed via the second gas supply channel 249 and the first gas supply channel 247, respectively, in some embodiments. In some embodiments, the process gases and the treatment gases may be flowed into the first processing region 215 via the same gas supply channel during different operations. In some embodiments, for the flowable deposition, the process gases may be flowed into the processing region 225 by the showerhead 220, bypassing the plasma region 215, whereas the precursors may be flowed into the plasma region 215 via the first or second gas supply channels 247, 249 and then flowed into the processing region 225 through the showerhead 220, to react with the process gases. In some embodiments, the treatment gases may also be flowed into the processing region 225 by the showerhead 220, bypassing the plasma region 215.

Figure 3A:
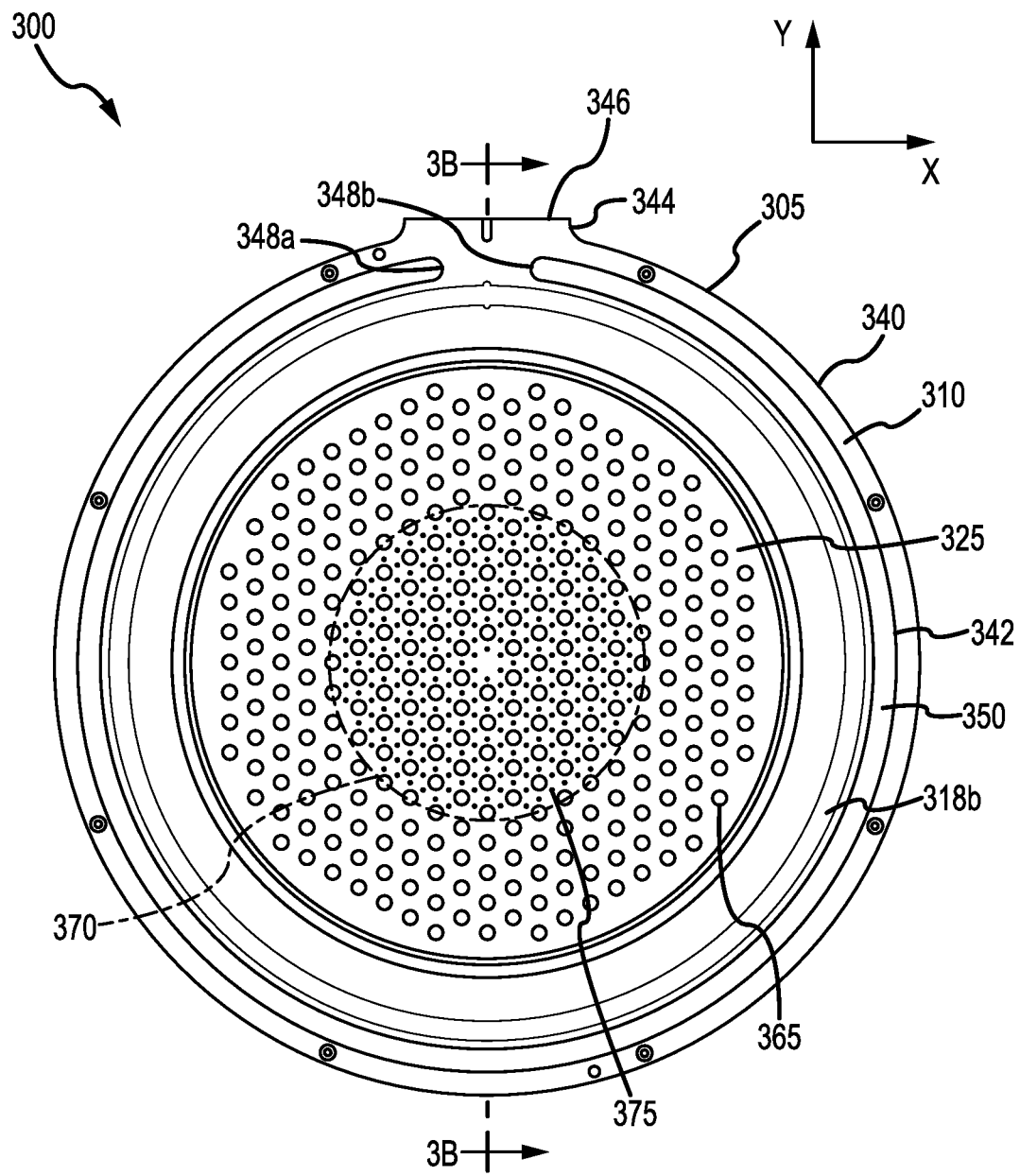
FIGS. 3A-3D show schematic views of exemplary showerhead configurations according to some embodiments of the disclosed technology.
Figure 3B:
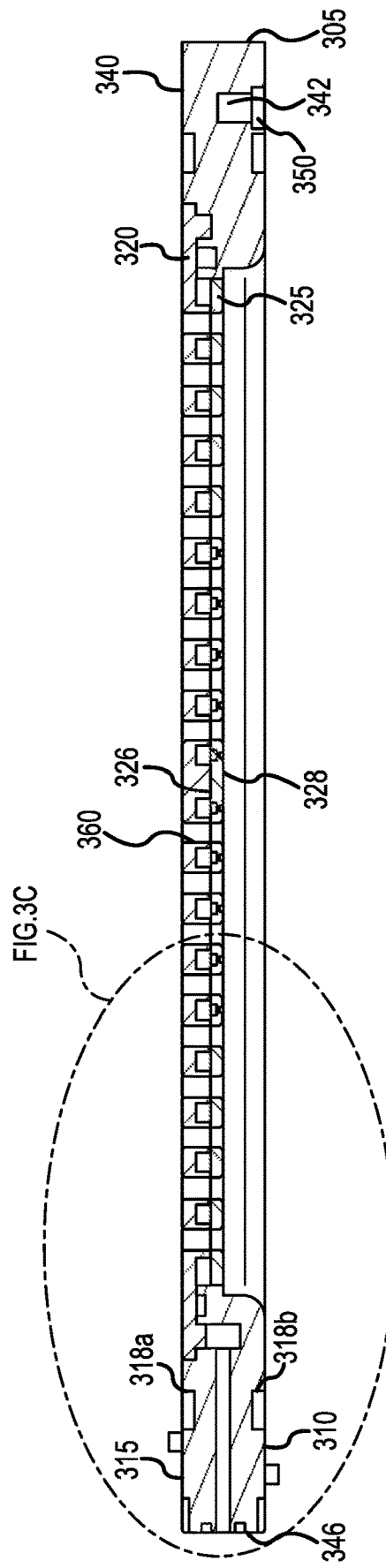
Figure 3C:
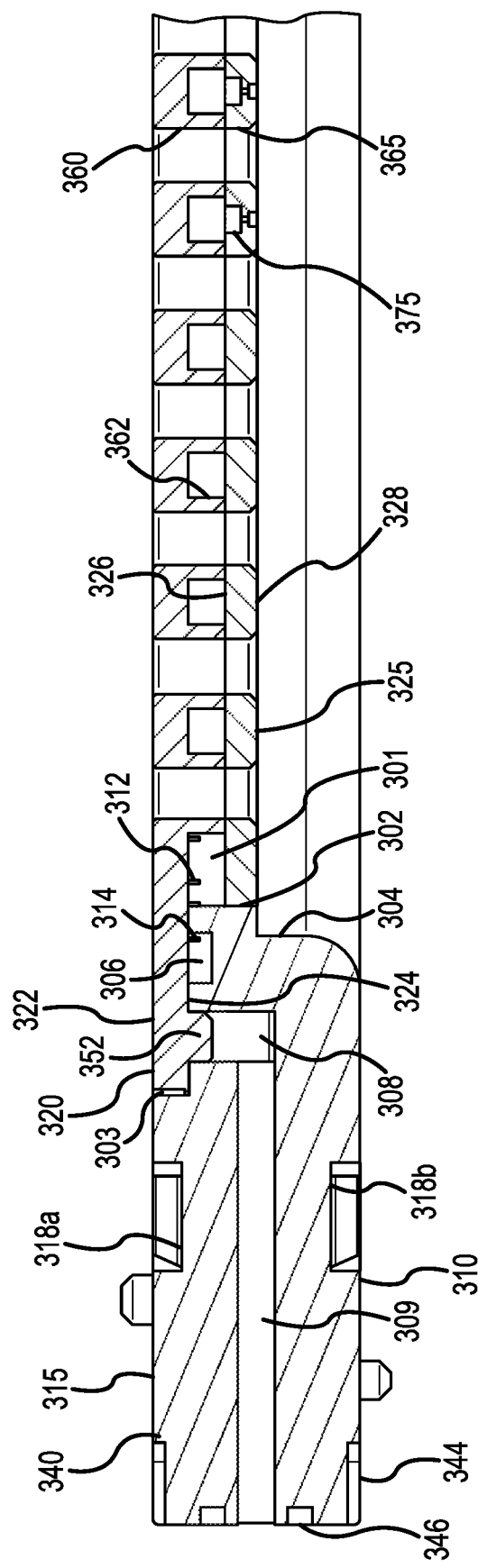
Figure 3D:
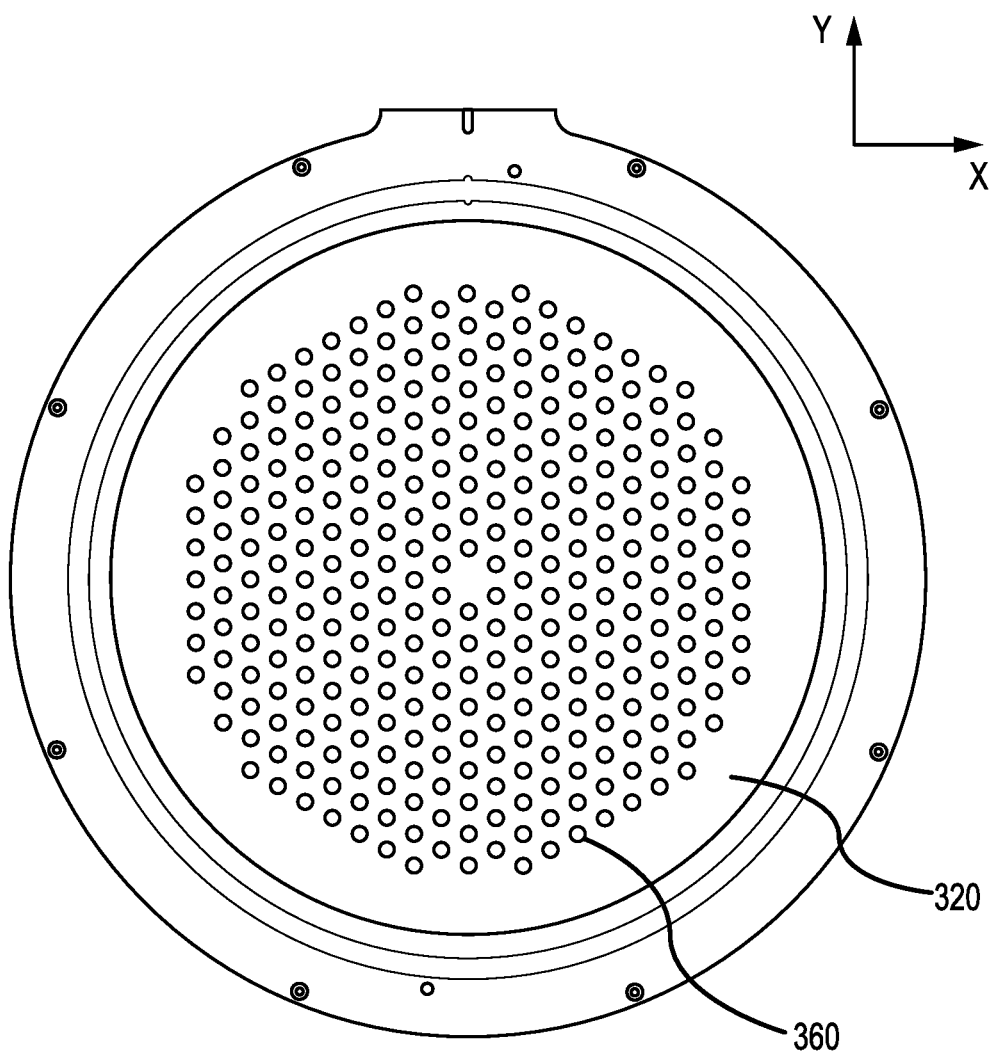

FIGS. 3A-3C illustrate schematically one embodiment of a gas distribution assembly 300 which may be used in the processing chamber 200 described above. FIG. 3A is a bottom plan view of the gas distribution assembly 300. FIG. 3B is a cross-sectional view of the gas distribution assembly 300 viewed along line 3B-3B of FIG. 3A. FIG. 3C illustrates a portion of the gas distribution assembly 300 shown in FIG. 3B. FIG. 3D illustrate a top plan view of the gas distribution assembly 300 shown in FIG. 3A. The gas distribution assembly 300 may be referred to as a dual channel showerhead (DCSH), which may allow for separate flows of precursors and processing gases for flowable deposition of a dielectric material as discussed above. The showerhead may alternatively be utilized for etching processes that allow for separation of etchants outside of a reaction zone to provide limited interaction with chamber components.

Referring to FIGS. 3A-3C, the gas distribution assembly 300 may generally include an annular body 340, an upper or first plate 320, and a lower or second plate 325. The annular body 340 may include an inner wall 301 located at an inner diameter, an outer wall 305 located at an outer diameter, an upper or top surface 315, and a lower or bottom surface 310. The upper surface 315 and lower surface 310 may define a thickness of the annular body 340. The inner wall 301 and the outer wall 305 may be cylindrical. In some embodiments, the annular body 340 may include a neck portion 344 protruding radially outward from the outer wall 305. The neck portion 344 may include a side wall 346 having one or more ports formed therein defining one or more inlets or outlets of various conduits and channels as will be described in more detail below.

The annular body 340 may further include a pair of isolation channels 318 formed therein, as illustrated in FIG. 3B. One isolation channel 318a of the pair may be formed in the upper surface 315 of the annular body 340, and the other isolation channel 318b of the pair may be formed in the lower surface 310 of the annular body 340. The terms upper and lower as used throughout the disclosure may refer to a position of the schematic illustration, and may or may not reflect the chamber component in an operational chamber. For example, the component may be incorporated within a chamber in multiple alternative configurations depending on the chamber design, and either the upper or lower surface identified may refer to the upstream or downstream side of the component. In some embodiments, the pair of isolation channels 318 may be vertically aligned with one another, and in some embodiments may be in direct vertical alignment. In some embodiments, the pair of isolation channels 318 may be horizontally offset from vertical alignment with one another. For example, the isolation channel 318a formed in the upper surface 315 may be positioned radially inward relative to the isolation channel 318b formed in the lower surface 310, or vice versa. In some embodiments, at least a portion of one of the isolation channels 318 may still be vertically aligned with a portion of the other of the isolation channels 318. In some embodiments, the pair of isolation channels 318 may not overlap vertically with each other. The isolation channels 318 may provide locations for isolation barriers, such as O-rings or other isolation devices.

A recess 342 as shown in FIG. 3B may be defined in the bottom surface 310 of the annular body 340 and configured to receive a heating element. The recess 342 may be a C-channel recess and may provide access for disposing the heating element within the recess 342. The recess 342 may be substantially annular except that the recess 342 may terminate near the neck portion 344 of the annular body 340 and may define two terminals 348a, 348b. A pair of channels or conduits may be formed in the neck portion 344. One end of each channel may terminate at the side wall 346 of the neck portion. The other end of one of the pair of channels may terminate near one of the terminals 348a, 348b of the recess 342, and the other end of the other of the pair of channels may terminate near the other of the terminals 348a, 348b of the recess 342. With this configuration, the heating element may be positioned inside the recess 342 and may extend outside the annular body 340 through the pair of channels in the neck portion 344. In some embodiments, the recess 342 may not terminate near the neck portion 344, but may extend toward and terminate at the sidewall 346 of the neck portion 344. The cover member 350 may also extend toward and terminate at the sidewall 346 of the neck portion 344. A recess cover member 350 may cover the recess 342. Each of the side walls of the recess 342 may define a step configured to support the recess cover member 350, and limit or prevent contact with the heating element.

Although the recess 342 is described herein as being configured to receive a heating element, the recess 342 may be configured to receive a cooling element, such as a cooling fluid, in some embodiments. In the embodiments shown in FIGS. 3A-3C, the recess 342 may be positioned radially outward of the isolation channel 318. In some embodiments, the recess 342 may be positioned radially inward of the isolation channel 318. Although the recess 342 is shown as being formed in the bottom surface 310 of the annular body 340, the recess 342 may be formed in the upper surface 315 of the annular body 340. In some embodiments, multiple recesses 342 may be formed in the upper surface 315 and/or the lower surface 310 for receiving either a cooling or heating element to maintain a temperature of the annular body 340.

With continued reference to FIG. 3C, the annular body 340 may include an upper recess 303 formed in the upper surface 315 extending radially outward of the inner wall 301 of the annular body 340. The annular body 340 may also include a first lower recess 302 formed in the lower surface 310 extending radially outward of the inner wall 301. The annular body 340 may further include a second lower recess 304 formed in the lower surface 310 below and extending further radially outward from the first lower recess 302. The upper recess 303 may be configured to receive therein the upper plate 320 such that an upper surface 322 of the upper plate 320 may be substantially flush with the upper surface 315 of the annular body 340. The first lower recess 302 may be configured to receive therein the lower plate 325 such that a lower surface 328 of the lower plate 325 may be substantially flush with the bottom of the second lower recess 304.

A first fluid channel 306 and a second fluid channel 308 may be defined in the recess portion of the upper surface 315 defined by the upper recess 303. The first fluid channel may be located in the annular body 340 radially inward of the second fluid channel 308. The first fluid channel 306 and the second fluid channel 308 may be covered by an edge portion of the upper plate 320 such that a flow path from the top of the second fluid channel 308 to the top of the first fluid channel may be prevented or substantially prevented. The first fluid channel 306 may be annular in shape and may be formed the entire distance around the annular body 340. A first plurality of ports 312 may be defined in an inner wall of the first fluid channel 306 and the inner wall 301 of the annular body 340. The ports 312 may provide access between the first fluid channel 306 and an internal volume 330 defined between the upper plate 320 and lower plate 325. In some embodiments, the ports 312 may be formed as through-holes in the portion of the annular body 340 defining the inner wall of the first fluid channel 306 and the inner wall 301 of the annular body 340. In some embodiments, the ports 312 may be formed as a plurality of recesses or slots at the top surface of the portion of the annular body 340 defining the inner wall of the first fluid channel 306 and the inner wall 301 of the annular body 340. When the upper plate 320 is received inside the upper recess 303 and coupled with the annular body 340, portions of a lower surface 324 of the upper plate 320 and the plurality of recesses may collectively define the ports 312.

The ports 312 may be defined around the circumference of the first fluid channel 306 at specific intervals, and may facilitate distribution across the entire volume 330 defined between the upper plate 320 and the lower plate 325. The intervals of spacing between the ports 312 may be constant, or may be varied in different locations to affect the flow of fluid into the volume 330. The inner and outer walls, radially, of the first fluid channel 306 may be of the same or similar height. In some embodiments, the inner wall of the first fluid channel 306 may be formed higher than the outer wall to affect the distribution of fluids in the first fluid channel 306 to avoid or substantially avoid the flow of fluid over the inner wall of the first fluid channel 306.

The second fluid channel 308 may be an annular shape and may be located radially outward from and concentric with first fluid channel 306. A second plurality of ports 314 may be defined in the portion of the annular body 340 defining the outer wall of the first fluid channel 306 and the inner wall of the second fluid channel 308. Similar to the first plurality of ports 312, in some embodiments, the second plurality of ports 314 may be formed as through-holes in the portion of the annular body 340 defining the outer wall of the first fluid channel 306 and the inner wall of the second fluid channel 308. In some embodiments, a plurality of recesses or slots may be formed at the top surface of the portion of the annular body 340 defining the outer wall of the first fluid channel 306 and the inner wall of the second fluid channel 308. Portions of the lower surface 324 of the upper plate 320 and the plurality of recesses may collectively define the second plurality of ports 314. The second plurality of ports 314 may be located at intervals of a pre-defined distance to provide fluid access to the first fluid channel 306 at several locations about the second fluid channel 308.

In some embodiments, the upper plate 320 may be formed with a protrusion 352 configured to seat within and seal a top portion of the second fluid channel 308. As shown in FIG. 3C, the second fluid channel 308 may be formed to a greater depth than the first fluid channel 306. The protrusion 352 of the upper plate 320 may extend into the second fluid channel 308 to a depth equivalent to the depth of the first fluid channel 306. With this configuration, warping that may occur in the upper plate 320 when coupled with the annular body 340 may be prevented from producing any leak paths between the first and second fluid channels 306, 308 as the extent of warping may be overcome by the amount of the protrusion 352 of the upper plate 320 extending into the second fluid channel 308. To avoid blockage by the protrusion 352 of the upper plate 320 extending into the second fluid channel 308, the second plurality of ports 314 may be formed at an angle increasing vertically between the second fluid channel 308 and the first fluid channel 306. The second plurality of ports 314 may be formed as angled throughholes or angled slots of various shapes or dimensions formed in the annular body 340.

The upper plate 320 may be a disk-shaped body, and may be coupled with the annular body 340 at the upper recess 303. The upper plate 320 may have a diameter selected to mate with the diameter of the upper recess 303. The upper plate 320 may comprise a plurality of first apertures 360 formed therethrough. The first apertures 360 may extend beyond the lower surface 324 of the upper plate 320 thereby forming a number of cylindrical bodies 362. Surrounding each cylindrical body 362 may be a gap. The outer walls of the cylindrical bodies 362, the lower surface 324 of the upper plate 320, an upper surface 326 of the lower plate 325, and a portion of the inner wall 301 may collectively define the internal volume 330 or showerhead volume 330.

As shown in FIG. 3D, the first apertures 360 may be arranged in a polygonal pattern on the upper plate 320, such that an imaginary line drawn through the centers of the outermost first apertures 360 define or substantially define a polygonal region or figure. In some embodiments, the polygonal region may be of a regular polygon shape having equal sides, and the sides may have an equal number or different numbers of the first apertures 360 along each side. In some embodiments, the polygonal region may have sides that may not be all equal, such as the sides of the twelve-sided polygon shown in FIG. 3D, and some sides may include a greater number of the first apertures 360 than the other sides. In some embodiments, the upper plate 320 may include a central region within which no first aperture 360 may be formed. In some embodiments, the central region of the upper plate 320 may also include one or more first apertures 360 formed therethrough.

As shown in FIG. 3D, the first apertures 360 may be arranged or distributed substantially throughout the entire upper plate 320. The polygonal region may occupy substantially the entire area defined by the upper surface 322 of the upper plate 320. In some embodiments, the distance between the center of the upper plate 320 and a vertex of the polygonal region, or the circumradius of a regular polygonal region, may be at least about 95% of the diameter of the upper plate 320. In some embodiments, the distance between the center of the upper plate 320 and a vertex of the polygonal region may be at least about 90%, at least about 85%, at least about 80%, at least about 75%, or at least about 70% of the diameter of the upper plate 320.

The first apertures 360 may be evenly arranged or distributed inside the polygonal region. Each of the first apertures 360 may be spaced from adjacent first apertures 360 at an equal distance. The arrangement or distribution of the first apertures 360 may also feature an array of staggered columns from about 5 to about 60 columns, such as from about 15 to about 25 columns of first apertures 360. Each column may have, along the y-axis, from about 3 to about 30 first apertures 360, such as from about 5 to about 25 first apertures 360. Each column may be spaced between about 0.4 and about 0.7 inches, such as about 0.54 inches, apart. The first apertures 360 may be equally spaced from one another in each column. Each first aperture 360 in a column may be displaced along the y-axis from a prior aperture between about 0.4 and about 0.8 inches, such as about 0.63 inches, from the respective centers. The first apertures 360 may be staggered along the x-axis from an aperture in another column by between about 0.2 and about 0.4 inches, such as 0.32 inches, along the y-axis from the respective centers.

Referring back to FIG. 3A, the lower plate 325 may be a disk-shaped body having a number of second apertures 365 formed therethrough. The lower plate 325 may also have a diameter that mates with the diameter of the inner wall 301 of the annular body 340 at the first lower recess 302. As can be seen in FIG. 3B, the upper surface 326 of the lower plates 325 and the lower surface 328 may define a thickness of the lower plate 32 that may be uniform across the diameter of the lower plate 325. In some embodiments, the lower plates 325 may include a thickness profile that may vary across the diameter of the lower plate 325.

The second apertures 365 may be arranged in a pattern that aligns with the pattern of the first apertures 360 as described above. The second apertures 365 may be arranged in a polygonal pattern on the lower plate 325, such that an imaginary line drawn through the centers of the outermost second apertures 365 define or substantially define a polygonal region or figure. In some embodiments, the polygonal region may be of a regular polygon shape having equal sides, and the sides may have an equal number or different numbers of the second apertures 365 along each side. In some embodiments, the polygonal region may have sides that may not be all equal, such as the sides of the twelve-sided polygon shown in FIG. 3A, such that some sides may include a greater number of the second apertures 365 than the other sides. In some embodiments, the lower plate 325 may include a central region within which no second aperture 365 may be formed. In some embodiments, the central region of the lower plate 325 may also include one or more second apertures 365 formed therethrough.

As shown in FIG. 3B, the second apertures 365 may be arranged or distributed substantially throughout the entire lower plate 325. The polygonal region may occupy substantially the entire area defined by the lower surface 328 of the lower plate 325. In some embodiments, the distance between the center of the lower plate 325 and a vertex of the polygonal region, or the circumradius of a regular polygonal region, may be at least about 95% of the diameter of the lower plate 325. In some embodiments, the distance between the center of the lower plate 325 and a vertex of the polygonal region may be at least about 90%, at least about 85%, at least about 80%, at least about 75%, or at least about 70% of the diameter of the lower plate 325.

The second apertures 365 may be evenly arranged or distributed inside the polygonal region. Each of the second apertures 365 may be spaced apart from adjacent second apertures 365 at an equal distance. The arrangement or distribution of the second apertures 365 may also feature an array of staggered columns from about 5 to about 60 columns, such as from about 15 to about 25 columns of second apertures 365. Each column may have, along the y-axis, from about 3 to about 30 second apertures 365, such as from about 5 to about 25 second apertures 365. Each column may be spaced between about 0.4 and about 0.7 inches, such as about 0.54 inches, apart. The second apertures 365 may be equally spaced from one another in each column. Each second aperture 365 in a column may be displaced along the y-axis from a prior aperture between about 0.4 and about 0.8 inches, such as about 0.63 inches, from the respective centers. The second apertures 365 may be staggered along the x-axis from an aperture in another column by between about 0.2 and about 0.4 inches, such as 0.32 inches, along the y-axis from the respective centers. When the upper plate 320 and lower plate 325 may be positioned one on top of the other, the first apertures 360 and the second apertures 365 may align. The upper and lower plates may be coupled with one another or directly bonded together. Under either scenario, the coupling of the upper plate 320 and the lower plate 325 may occur such that the first apertures 360 and the second apertures 365 may be aligned to form a channel through the upper plate 320 and the lower plate 325.

Although FIGS. 3A and 3D illustrate a polygonal arrangement of the first and second apertures 360, 365, the arrangement of the first apertures 360 and/or the second apertures 365 may make any other geometrical pattern. In some embodiments, the first apertures 360 and the second apertures 365 may be distributed as concentrically located rings of apertures. Each ring of apertures may be of a polygonal or circular shape. Each outwardly located ring may have the same, greater, or lesser number of apertures than the preceding ring located inwardly. In some embodiments, each concentric ring may have an additional number of apertures based on the geometric shape of each ring. In the embodiments where each ring of the first or second apertures 360, 365 may define a six-sided polygon, each ring moving outwardly may have six apertures more than the ring located directly inward, with the first internal ring having six apertures. With a first ring of first and/or second apertures 360, 365 located nearest to the center of the upper and/or lower plates 320, 325, the upper and/or lower plates may each have more than two rings, and depending on the arrangement of apertures, may have between about one and about fifty rings of apertures. Alternatively, the upper and/or lower plates 320, 325 may have between about two and about forty rings, or up to about thirty rings, about twenty rings, about fifteen rings, about twelve rings, about ten rings, about nine rings, about eight rings, about seven rings, about six rings, etc. or less. In one example, as shown in FIGS. 3A and 3D, there may be about ten hexagonal rings on the upper and lower plates 320, 325.

In some embodiments, each of the concentric rings may extend outwardly at an equal distance from the adjacent inwardly located ring. In some embodiments, one or more of the concentric rings may extend outwardly at varied distances from the adjacent inwardly located ring. In some embodiments, the concentric rings may be similarly shaped, such as the first to the ninth rings of the example shown in FIGS. 3A and 3D. In some embodiments, one or more concentric rings may not be similarly shaped from the other concentric rings. For example, the tenth ring of the example shown in FIGS. 3A and 3D may define a twelve-sided polygon whereas the first to the ninth rings may each define a six-sided polygon or a hexagon.

With continued reference to FIGS. 3A and 3B, the lower plate 325 may have a number of third apertures 375 formed therethrough. Different from the second apertures 365 which may be arranged throughout substantially the entire area defined by the lower surface 328 of the lower plate 325, the third apertures 375 may be formed in a region 370 less than the area defined by the lower surface 328 of the lower plate 325 or the region where the second apertures 365 may be arranged. Outside the region 370, there may be no third apertures 375, only the second apertures 365. In some embodiments, the region 370 within which the third apertures 375 may be arranged may be circular, such as shown in FIG. 3A. The diameter of the region 370 may be between about 20% and about 80% of the diameter of the lower plate 325. In some embodiments, the diameter of the region 370 may be about 20%, about 25%, about 30%, about 35%, about 40%, about 45%, about 50%, about 55%, about 60%, about 65%, about 70%, about 75%, or about 80% of the diameter of the lower plate 325. The diameter of the region 370 may be between about 2 inches and about 10 inches. Although a circular region is shown in FIG. 3A, the region 370 may be polygonal. The region 370 may define a convex polygon or star polygon. The region 370 may define a regular polygon with equal sides or may define a polygon that may not have equal sides. In some embodiments, the region 370 may define a shape that may include multiple curved sides.

Within the region 370, the plurality of second apertures 365 and the plurality of third apertures 375 may form alternating staggered columns. The third apertures 375 may be arranged in between at least two of the second apertures 365 of the lower plate 325. Between each second aperture 365 there may be a third aperture 375, which may be evenly spaced from the two second apertures 365. Accordingly, the third apertures 375 may be evenly distributed around the second apertures 375 within the region 370. There may also be a number of third apertures 375 positioned around the center of the lower plate 325 in a hexagonal pattern, such as for example six third apertures, or a number of third apertures 375 forming another geometric shape. In some embodiments, there may be no third aperture 375 formed in the center of the lower plate 325, where in other embodiments, a third aperture 375 may be formed in the center of the lower plate 325.

Within the region 370, the third apertures 375 may be arranged in a polygonal pattern on the upper plate 320, such that an imaginary line drawn through the centers of the outermost third apertures 375 may define a polygonal region or figure. In some embodiments, the polygonal region may be of a regular polygon shape having equal sides, and the sides may have equal number or different numbers of the third apertures 375 along each side. For example, the polygonal region defined by the arrangement of the third apertures 375 may be a twelve-sided polygon having equal sides, and some of the sides may have 6 of the third apertures 375 disposed therealong whereas some of the sides may have 4 of the third apertures 375 disposed therealong. In some embodiments, the polygonal region may have sides that may not be all equal, and some sides may include a greater number of the third apertures 375 than the other sides.

As shown in FIG. 3A, the third apertures 375 may be arranged or distributed as concentrically located rings of apertures. Each ring of apertures may be of a polygonal or circular shape. In the embodiment shown in FIG. 3A, the third apertures 375 may be arranged in a number of concentrically located six-sided polygons or hexagons. Similar to the arrangement of the second apertures 365 where the inner most hexagonal ring of the second apertures 365 may only have the second apertures 365 arranged at the vertices of the inner most hexagon and have no second apertures 365 arranged along the side of the inner most hexagon, the inner most hexagonal ring of the third apertures 375 may only have the third apertures 375 arranged at the vertices of the inner most hexagon and have no third apertures 375 arranged along the side of the inner most hexagon. Different from the arrangement of the second apertures 365 shown in FIG. 3A where each concentrically located hexagonal ring may have the second apertures 365 arranged along the sides as well as at the vertices of the hexagon, some of the concentrically located hexagonal rings of the third apertures 375 may include the third apertures 375 along the sides as well as at the vertices of the hexagons, whereas others of the concentrically located hexagonal rings may include the third apertures 375 along the sides, but may not include the third apertures 365 at the vertices of the hexagons. The hexagonal rings of the third apertures 375, with the third apertures 375 removed from the vertices and the hexagonal rings of the third apertures having the third apertures 375 at the vertices, may be arranged in an alternating manner.

For example, as shown in FIG. 3A, the inner most hexagonal ring, which may be referred to as the first ring, may include six third apertures 375 arranged at the vertices of the hexagon; the hexagonal ring outwardly located immediately next to the first ring, which may be referred to as the second ring, may include only one third aperture 375 arranged at the middle of each side of the hexagon and, at the vertices of the second ring, one second aperture 365 instead of a third aperture 375 may be disposed; the hexagonal ring outwardly located immediately next to the second ring, which may be referred to as the third ring, may include two third apertures 375 arranged along the sides of the hexagon and one third aperture 375 arranged at each vertex of the third ring; the hexagonal ring outwardly located immediately next to the third ring, which may be referred to as the fourth ring, may include two third apertures 375 arranged along the sides of the hexagon, and at the vertices of the second ring one second aperture 365 instead of a third aperture 375 may be disposed; and so forth. In the example shown in FIG. 3A, within the region 370, there may be ten hexagonal rings of third apertures 375, with the second, fourth, sixth, eighth, and tenth hexagonal rings having the third apertures 375 arranged along the sides of the hexagons but have the second apertures instead of the third apertures 375 arranged at the vertices, and the third, fifth, seventh, and ninth rings have the third apertures 375 arranged along the sides as well as at the vertices of the hexagons. Depending on the size of the region 370, more or less of the concentric rings of the third apertures may be arranged in various embodiments. As is also shown in FIG. 3A, an eleventh ring of the third apertures 375 may be included. However, the eleventh ring may have only six third apertures 375 arranged along a portion of each side of the eleventh ring such that all the third apertures 375 may be contained within the region 370. Inclusion of the "incomplete" eleventh ring, or even additional "incomplete" hexagonal rings, of the third apertures 375 may improve the symmetry of the distribution of the third apertures 375 within the region 370, which further improve fluid distribution from the third apertures 375 into a processing region below the lower plate 325.

The first, second, and third apertures 360, 365, 375 may all be configured to allow the passage of fluid therethrough. As stated previously, the upper plate 320 may be positioned within the upper recess 303 with the cylindrical bodies 362 facing toward the upper surface 326 of the lower plate 325. The lower plate 325 may then be positioned in the first lower recess 302 and rotatably oriented so that the axes of the first and second apertures 360, 365 may be aligned. Alternatively, the lower plate 325 may be first positioned within the first lower recess 302, and then the upper plate 320 may be positioned within the upper recess 303 and rotatably oriented so that the axes of the first and second apertures 360, 365 may be aligned. The upper plate 320 and lower plate 325 may then be E-beam welded or otherwise bonded to the annular body 340. The upper plate 320 may be sealingly coupled with the lower plate 325 to fluidly isolate the first and second apertures 360, 365 from the third apertures 375. For example, the upper plate 320 may be brazed to the lower plate 325 such that a seal may be created between a surface of each of the cylindrical bodies 362, and portions of the upper surface 326 of the lower plate 325 around each second aperture 365. With this configuration, the first and second apertures 360, 365 may define a set of first fluid flow passages which may be fluidly isolated from a set of second fluid passages defined by the third apertures 375. A fluid flowed through the set of the first fluid flow passages and a fluid flowed through the set of second fluid flow passages may be fluidly isolated from each other until the fluids separately exit the lower plate 325.

For example, a first fluid, such as a silicon-containing precursor for forming a flowable dielectric film on a substrate, may be introduced from outside a process chamber into the internal showerhead volume 330 defined by the upper and lower plates 320, 325. The first fluid may be introduced into the showerhead volume 330 through a delivery channel 309 located in the side of the annular body 340, which may be in fluid communication with the second fluid channel 308 discussed above. The first fluid may then flow from the delivery channel 309 into the second fluid channel 308, then into the first fluid channel 306 through the second plurality of ports 314, and then into the internal volume 330 through the first plurality of ports 312. The first fluid may then exit the internal volume 330 through the third apertures 375, or the second fluid flow passages, and flow into a processing region of the process chamber, such as the processing region 225 of the process chamber 200. A second fluid, such as the process gas, may be introduced into a plasma region of a process chamber above the gas distribution assembly 300, and then flowed into the processing region through the first and second apertures 360, 365 or the first fluid flow passages. The precursor and the process gas provided in such a fashion may be isolated or substantially isolated from each other until the precursor and the process gas separately exit the lower plate 325. The precursors and the process gas may then form a mixture and react with each other in the processing region to allow for flowable deposition of a film onto the substrate. Separation of the process gas and the precursor may provide numerous benefits including preventing radicals of one fluid, such as radicals of the process gas, from contacting the precursor, prior to reaching the processing region. By preventing the interaction of the fluids prior to mixing in the processing region in which deposition is desired, undesirable deposition in other regions and on the showerhead may be minimized.

Figure 4:
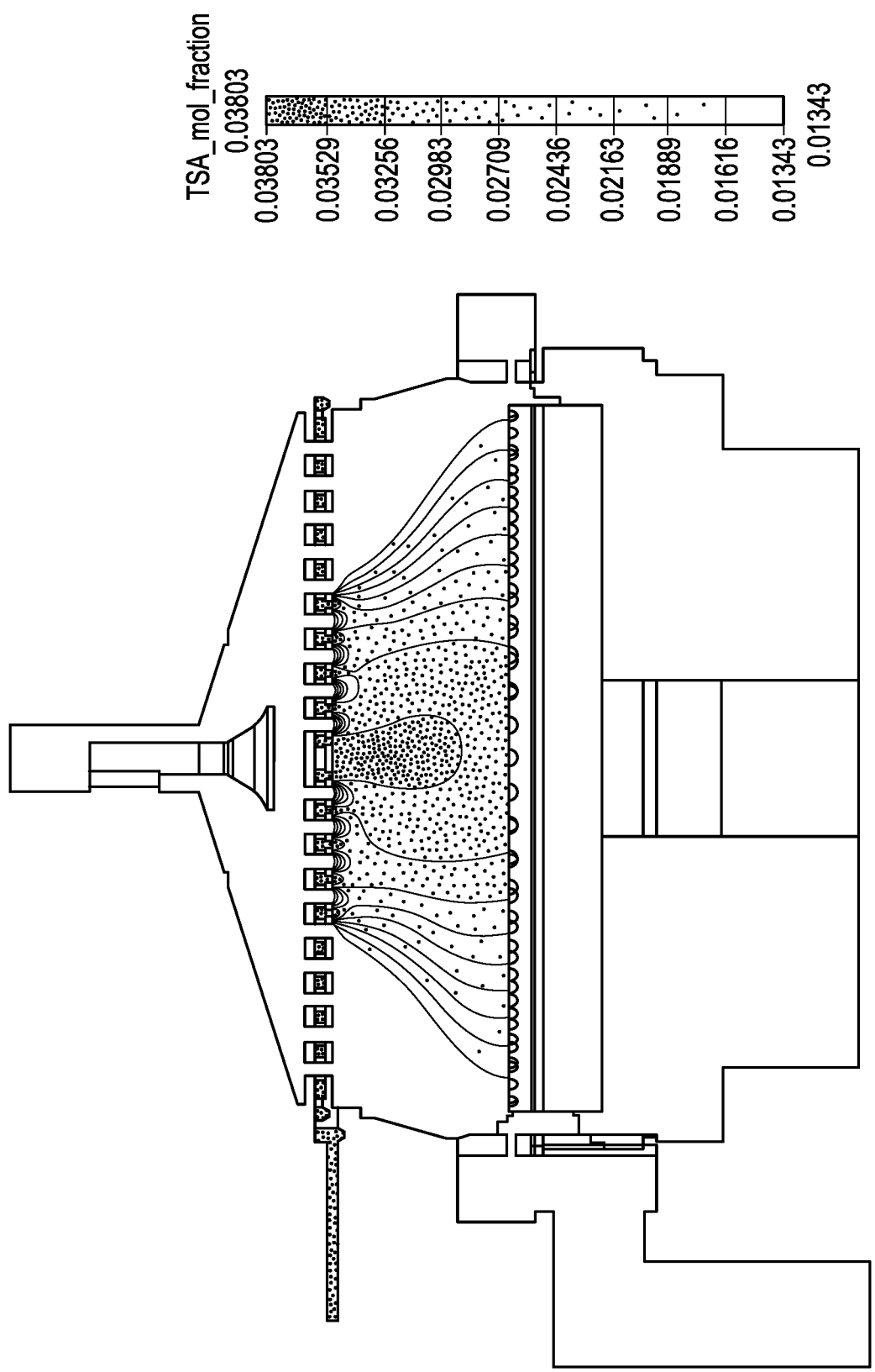
FIG. 4 shows a fluid mixing profile within a processing region of a process chamber according to some embodiments of the present technology.

FIG. 4 illustrates a mixture of fluids within a processing region of a process chamber, such as the processing region 225 of the process chamber 200. Various chamber components are now shown in FIG. 4, and illustrated are internal spaces or volumes defined by some of the components of the process chamber. As mentioned above with reference to FIG. 2, the processing region 225 may be defined at least in part by the showerhead 220, the spacer ring 230, the pumping liner 240, and the pedestal 250. The spacer ring 230 may include an angled inner wall. The pumping liner 240 may include a cylindrical inner wall. Accordingly, the processing region 225 may include an upper frustum volume and a lower cylindrical volume. In some embodiments, the inner wall of the spacer ring 230 may not be angled and may be a substantially vertical wall that may align with the inner wall of the pumping liner 240. With this configuration, the processing region 225 may include one cylindrical volume.

When a process gas may be introduced into the processing region 225 through the first and second apertures 360, 365, because the first and second apertures 360, 365 may be formed throughout substantially the entire upper and lower plates 320, 325, the process gas may be distributed throughout the entire volume of the processing region 225. The process gas may contact the chamber walls which may include, for example, the inner walls of the spacer ring 230 and the pumping liner 240. In operation, portions of the chamber walls below a plurality of pumping holes 242 formed through the pumping liner 240 may not be exposed to the process gas or exposure may be limited because the process gas may be pumped outside the processing region 225 through the pumping holes 242 before reaching below the pumping holes 242 inside the processing region.

When a precursor may be introduced into the showerhead volume 330 through the delivery channel 309 and then into the processing region 225 through the third apertures 375, because the third apertures 375 may be formed within the region 370 less than the entire bottom surface 328 of the lower plate 325, the precursor may not be distributed throughout the entire volume of the processing region 225. As shown in FIG. 4, the precursor may be distributed into a volume that may be less than the entire volume of the processing region 225 and may define substantially a frustum volume or frustum-shaped volume. The frustum volume may include an upper surface that may substantially correspond to the region 370 within which the third apertures 375 may be formed. The frustum volume may include a lower surface greater than the upper surface, and the lower surface may substantially correspond to a surface area of the substrate 235 disposed on top of the pedestal 250. The frustum volume may include a side surface extending between the upper surface and the lower surface. In some embodiments, the side surface may include convex portions proximate the upper and lower surfaces. The side surface may further include a slightly concave portion between the convex portions. In some embodiments, the side surface may include a portion between the convex portions that may be substantially non-curved or may be slightly convex. It should be noted that in some embodiments, there may still be precursors distributed outside the frustum volume, and the frustum volume described herein may refer to a region outside which the concentration of the precursors may be below certain threshold values.

With the precursor distributed substantially within the frustum volume, exposure of the chamber walls to the precursor may be reduced or minimized. Further, as discussed above, because the processing gas may be distributed throughout the entire volume of the processing region 225, the frustum volume may be contained within the volume of the process gas, and the processing gas may serve as a fluid barrier between the frustum volume of the precursor and the chamber walls to further prevent the distribution of the precursor towards the chamber walls. Accordingly, minimum or substantially no reaction between the process gas and the precursor may occur near the chamber walls, and undesirable deposition of dielectric materials onto the chamber walls may be prevented or substantially prevented, which may further reduce the cleaning time and improve throughput.

Further, because the third apertures 375 may be arranged within the region 370 less than the region within the second apertures 365 may be arranged, any unwanted deposition due to the reaction between the process gas and precursor near the showerhead 220, 300 may also be reduced. Minimal or substantially no undesirable deposition may occur at the lower plate 325 outside the region 370 where only second apertures 365 may be arranged but no third apertures 375 may be arranged. Reduced or minimized undesirable deposition onto the chamber walls and/or the showerhead 220, 300 may further reduce or minimize defects in the deposited dielectric film which may be caused by the undesirable deposition on the chamber walls and/or showerhead 220, 300 flaking off of the chamber walls and/or the showerhead 220, 300 and falling onto the substrate 235.

Because reaction between the processing gas and the precursor may occur mainly within the frustum volume where the precursor may be distributed, deposition of the dielectric material may occur mainly at the surface of the substrate 235, which may further reduce the amount of the precursor required to form a desired dielectric film on the substrate 235. Compared with a showerhead assembly which may include third apertures 375 formed throughout the entire region within which the second apertures 365 may be formed, the showerhead 300 with the region 370 having a diameter about 50% of the diameter of the lower plate 325 may result in between about 40% to about 80% reduction in precursor consumption, and may lead to at least about 50%, at least about 60%, at least about 70% or more, reduction in the precursor consumption in various embodiments. The showerhead 300 with the region 370 having a diameter about 70% of the diameter of the lower plate 325 may result in between about 30% to about 60% reduction in precursor consumption, and may lead to at least about 40%, at least about 50% or more, reduction in the precursor consumption in various embodiments.

The reduction in the consumption of the precursor may also be attributed to the frustum shape of the volume within which the precursor may be distributed. As mentioned above, because the lower surface of the frustum volume, which may define the greatest horizontal surface or plane across the frustum volume, may substantially correspond to the surface area of the substrate 235, the reaction products, i.e., the dielectric material, may mostly be deposited on the substrate as opposed to being pumped away through the pumping holes 242. Furthermore, because less precursor may be required, the flow rate may also be reduced. The precursor may be flowed through the showerhead 300 having the third apertures 375 formed only within the smaller region 370 at a flow rate that may be about 50%, about 40%, about 30%, about 20% or less, of a flow rate at which the precursor may be flowed through a showerhead having the third apertures 375 formed throughout the entire lower plate. With the reduced flow rate of the precursor, the pressure within the processing region 225 may be further reduced, which may further improve the uniformity of the film formed on the substrate.

With further reference to FIG. 4, in some embodiments, the distribution of the precursor within the frustum volume may not be even. For example, the concentration of the precursor near the axis of the frustum volume may be greater than the concentration of the precursor near the side surface of the frustum volume. The concentration of the precursor may gradually reduce from the axis of the frustum volume to the side surface of the frustum volume. In some embodiments, the concentration of the precursor near the side surface of the frustum volume may be between about 80% to about 30% of the concentration of the precursor near the axis of the frustum volume, and may be about 70%, about 60%, about 50%, about 40% or less, of the concentration of the precursor near the axis of the frustum volume. The horizontal variation of the precursor concentration within the frustum volume may not lead to unsatisfactory film profile deposited on the substrate 235 given that the film deposited may be flowable. Even for less flowable film to be deposited, when the process concentration may be kept substantially the same throughout the processing region 225, the variation of the thickness of the film deposited resulting from the variation of the concentration of the precursor may be negligible.

In some embodiments, the concentration of the precursor and/or the concentration of the process gas may be further moderated by the configuration of the baffle 265 and the size and shapes of the first, second, and third apertures 360, 365, 375. For example, the baffle 265 may direct the flow of the process gas such that the process gas may be more evenly distributed as compared to when the process gas first exits the gas inlet assembly 245. The first, second and third apertures 360, 365, 375 may be further configured to modify the flow of the precursor and process gas. For example, the respective axes of the first, second, and third apertures 360, 365, 375 may be configured in various manners to modify or direct the flow of the first and second fluids, or the precursor and the process gas, into the processing region 225. In some embodiments, the plurality of first apertures 360 and the plurality of second apertures 365 may have their respective axes aligned or substantially aligned with each other. The aligned axes of the first and second apertures 360, 365 and the axes of the third apertures 375 may be parallel or substantially parallel to one another. In operation, the showerhead 220, 300 may have a substantially horizontal orientation such that the axes of the first, second, and third apertures 360, 365, 375 may be perpendicular or substantially perpendicular to the surface of the substrate 235. In some embodiments, the axes of the first and second apertures 360, 365 and the axes of the third apertures 375 may be angled from each other, such as from about 1° to about 80°, for example, from about 10 to about 30°. In some embodiments, each of the respective axes of the first and second apertures 360, 365 may be angled from each other, such as from about 1° to about 80°, for example, from about 10 to about 30°. Each of the respective axis of the third apertures 375 may be angled from each other, such as from about 1° to about 80°, for example, from about 1° to about 30°. In some embodiments, the first apertures 360 and the second apertures 365 may have their respective axes disposed at an angle from about 1° to about 30° from one another.

The respective sizes and shapes of the first, second, and third apertures 360, 365, 375 may also be configured in various manners to further modify or direct the flow of the precursor and the process gas into the processing region 225. The first, second, and third apertures 360, 365, 375 may have cylindrical shape and may, alternatively, have a varied cross-sectional shape including conical, cylindrical, or a combination of multiple shapes. In the embodiments as shown in FIG. 3B, the first and second apertures 360, 365 may have a substantially cylindrical shape, and the third apertures 375 may be formed by a series of cylinders of different diameters. For example, the third apertures may comprise three cylinders where the second or middle cylinder may be of a diameter smaller than the diameters of other or top and bottom cylinders. In some embodiments, the third apertures 375 may also have a cylindrical shape of a diameter consistent through the entire height. These and numerous other variations can be used to modulate the flow of fluid through the apertures.

In some embodiments, the diameter of the apertures for directing the flow of the same fluid may also vary to facilitate uniform distribution of the fluid. For example, as the process gas flows from the gas inlet assembly 245 into the plasma region 215 of the processing chamber, the flow of process gas may be such as to preferentially flow a greater volume of the process gas through certain apertures. As such, certain of the first and second apertures 360, 365 may be reduced in diameter from certain other first and second apertures 360, 365 in order to redistribute the process gas flow. For example, the first and second apertures 360, 365 near the baffle 265 may be selectively reduced in diameter to reduce the flow of process gas through those apertures. As mentioned above, the concentration of the precursor within the frustum volume may vary. If needed, the diameters of select third apertures 375 within the region 370 may be reduced or increased, depending on the desired concentration of the precursor within the frustum to be achieved.

As can be seen from the discussion above, the flow of the precursor, and thus the shape of the frustum volume, such as the upper surface and the lower surface of the frustum volume, may be determined in part by the shape and/or size of the region 370 within which the third apertures 375 may be formed, by the arrangement of the first, second, and third apertures 360, 365, 375 within the showerhead 300 and the individual size and shape thereof, by the flow rate of the precursor, by the vertical distance between the third apertures 375 and the pumping holes 242, by the pressure inside the processing region 225, and many other factors. Accordingly, in order to achieve a full coverage of the substrate surface by the lower surface of the frustum, while at the same time minimizing undesirable deposition onto the showerhead and the chamber walls, the size and/or shape of the region 370 within which the third apertures 375 may be formed may be appropriately configured by taking into account the desired flow rate of the precursor, the vertical distance between the third apertures 375 and the pumping holes 242, and many other factors.

Figure 5:
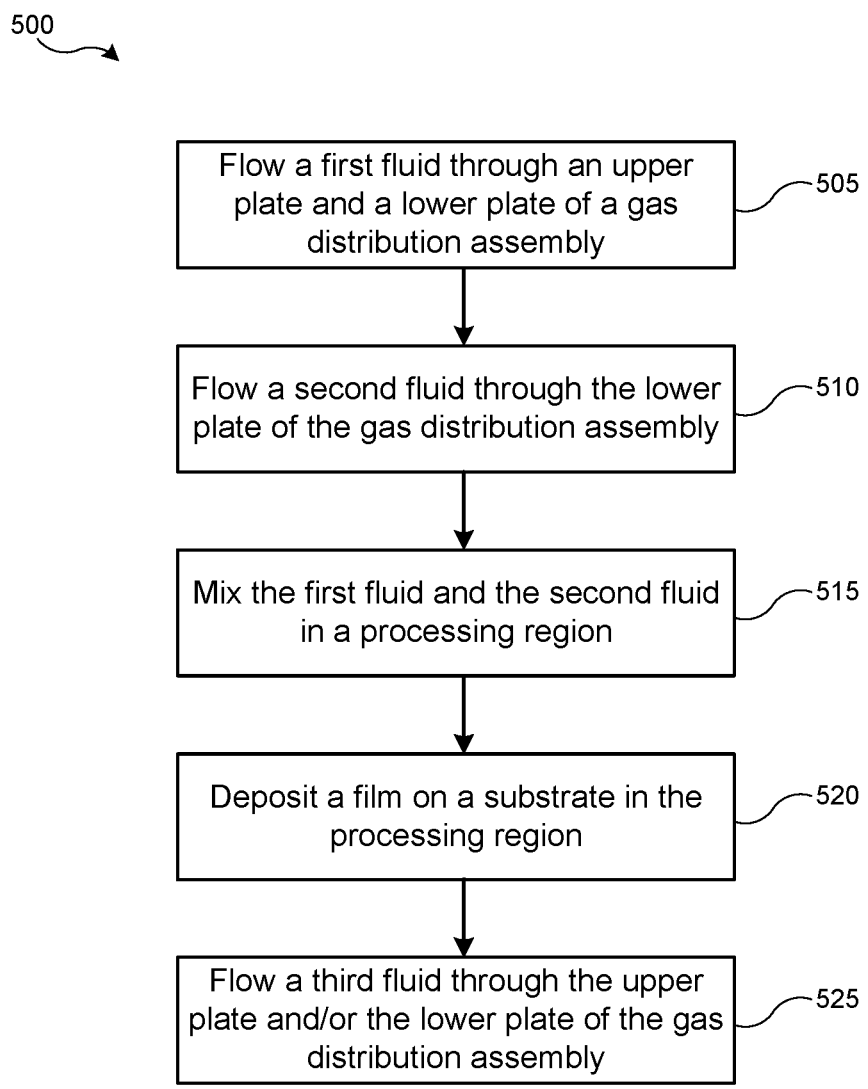
FIG. 5 shows exemplary operations in a method according to some embodiments of the present technology.

With reference to FIG. 5, exemplary operations of a method 500 for film deposition utilizing a chamber system including a gas distribution assembly are shown. The gas distribution assembly may be similar to or the same as the gas distribution assembly 300. Accordingly, the gas distribution assembly may include a first or upper plate, such as the upper plate 320 of the gas distribution assembly 300, and a second or lower plate, such as the lower plate 325 of the gas distribution assembly 300. The upper plate may be a disk-shaped body having a plurality of first apertures extending beyond a lower surface of the upper plate thereby forming a plurality of cylindrical bodies. The lower plate may also be a disk-shaped body and may have a plurality of second apertures formed through the lower plate. The second apertures may be aligned with the first apertures. The lower plate may also include a plurality of third apertures formed through the lower plate. The third apertures may be disposed in an area less than the area within which the second apertures may be disposed. The arrangement and configuration of the first, second, and third apertures may be similar to or the same as the arrangement and configuration of the first, second, and third apertures 360, 365, 375 of the gas distribution assembly 300. Accordingly, the first and second apertures may be fluidly isolated from an internal volume defined by the upper and lower plates, whereas the third apertures may be in fluid communication with the internal volume.

Method 500 may include flowing a first fluid, such as a process gas, through the first and second apertures through the upper plate and the lower plate at operation 505. Method 500 may further include flowing a second fluid, such as a precursor, through the third apertures through the lower plate at operation 510. As discussed above, the gas distribution assembly may be configured to fluidly isolate the first and second apertures from the third apertures such that the first and second fluids may not be mixed when they may be flowed through the upper and/or lower plates of the gas distribution assembly. Method 500 may further include forming a mixture of the first fluid and the second fluid in a processing region of the processing chamber at operation 515 after the first fluid and the second fluid exit the gas distribution assembly. Method 500 may further include depositing a film on a substrate disposed within the processing region at operation 520. As discussed above, because the third apertures may be arranged only within a region smaller than the region within which the first and second apertures may be arranged, the mixture of the first and second fluids formed by method 500 may include a concentration or mixture distribution similar to that of the mixture of the process gas and the precursor discussed above with reference to FIG. 4. Accordingly, film deposition may mostly occur on the substrate and minimum deposition may occur on the gas distribution assembly or chamber walls.

In some embodiments, method 500 may further include flowing a third fluid, such as a treatment gas into the processing region at operation 525. The treatment gas may be flowed into the process chamber for removing any unwanted deposition formed inside the processing region, such as deposition formed on the showerhead and the chamber wall. In some embodiments, the third fluid may be flowed into the processing region from a plasma region above the gas distribution assembly through the first and second apertures. In some embodiments, the third fluid may be flowed into the processing region from outside the chamber into the showerhead volume defined by the upper and lower plates, and then into the processing region through the third apertures.

In the preceding description, for the purposes of explanation, numerous details have been set forth in order to provide an understanding of various embodiments of the present invention. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the plate" includes reference to one or more plates and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or steps, but they do not preclude the presence or addition of one or more other features, integers, components, steps, acts, or groups.

What is claimed is:

1. A gas distribution assembly, comprising:
   a first plate having a disk shape and a plurality of first apertures formed therethrough, wherein the plurality of first apertures extend beyond a lower surface of the first plate thereby forming a plurality of cylindrical bodies;
   a second plate positioned axially below the first plate and having a disk shape, the second plate comprising:
      a plurality of second apertures formed in a first region and a second region of the second plate and through the second plate, wherein the first region of the second plate extends to an exterior edge of the second plate, and wherein the plurality of second apertures align with the plurality of first apertures; and
      a plurality of third apertures formed in the second region of the second plate and through the second plate, wherein an area defined by the second region is a central region of the second plate, wherein the area defined by the second region is less than an area defined by the first region, wherein third apertures are only formed within the second region and are not formed within the first region of the second plate; and
   wherein the second plate is sealingly coupled with the first plate to define a volume between the first plate and the second plate, wherein the volume is fluidly accessible from the plurality of third apertures, and wherein the volume is fluidly isolated from the plurality of first apertures and the plurality of second apertures.

2. The gas distribution assembly of claim 1, wherein the first region and the second region are similarly shaped and coaxially aligned with the second plate.

3. The gas distribution assembly of claim 1, wherein the second region defines a circle having a diameter of about 50% of a diameter of the second plate.

4. The gas distribution assembly of claim 3, wherein the diameter of the circle is between about 2 inches and about 10 inches.

5. The gas distribution assembly of claim 1, wherein the second plate further comprises a third region having no second or third apertures formed therein, wherein the first region, the second region, and the third region are coaxially aligned with the second plate.

6. The gas distribution assembly of claim 1, wherein each of the plurality of second apertures is spaced apart from adjacent second apertures at an equal distance.

7. The gas distribution assembly of claim 1, wherein the plurality of third apertures are distributed evenly around the plurality of second apertures within the second region of the second plate.

8. The gas distribution assembly of claim 1, further comprising:
   an annular body comprising:

an inner wall positioned at an inner diameter;
an outer wall positioned at an outer diameter;
an upper surface;
a lower surface;
an upper recess formed into the upper surface;
a lower recess formed into the lower surface;
and a fluid delivery channel in the annular body; and
wherein:
    the first plate is positioned in the upper recess;
    the second plate is positioned in the lower recess; and
    the fluid delivery channel is in fluid communication with the volume between the first plate and the second plate.

9. A semiconductor processing chamber, comprising:
a gas distribution assembly having a first plate and a second plate, wherein:
    the first plate has a disk shape and a plurality of first apertures formed therethrough, wherein the plurality of first apertures extend beyond a lower surface of the first plate thereby forming a plurality of cylindrical bodies that seat on an upper surface of the second plate;
    the second plate has a disk shape and is positioned axially below the first plate, the second plate comprises:
        a plurality of second apertures formed in a first region of the second plate and a second region of the second plate, the second apertures extending through the second plate, wherein the plurality of second apertures align with the plurality of first apertures to form a plurality of fluid channels through the first apertures and the second apertures; and
        a plurality of third apertures formed exclusively in the second region of the second plate and through the second plate, wherein an area defined by the second region is less than an area defined by the first region; and
    wherein the second plate is sealingly coupled with the first plate to define a volume between the first plate and the second plate, wherein the volume is fluidly accessible from the plurality of third apertures, and wherein the volume is fluidly isolated from the plurality of first apertures and the plurality of second apertures.

10. The semiconductor processing chamber of claim 9, further comprising a baffle positioned axially above the gas distribution assembly.

* * * * *